United States Patent
Huang et al.

(10) Patent No.: US 9,684,747 B2
(45) Date of Patent: Jun. 20, 2017

(54) PARAMETER MODELING FOR SEMICONDUCTOR ARRANGEMENTS

(71) Applicant: Taiwan Semiconductor Manufacturing Company Limited, Hsin-Chu (TW)

(72) Inventors: Mu-Jen Huang, Taipei (TW); Zhi Zhong Hu, Shanghai (CN); Zong-liang Cao, Shanghai (CN); Feng Zhu, Shanghai (CN)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 205 days.

(21) Appl. No.: 14/612,526

(22) Filed: Feb. 3, 2015

(65) Prior Publication Data

US 2016/0063157 A1 Mar. 3, 2016

(30) Foreign Application Priority Data

Sep. 1, 2014 (CN) .......................... 2014 1 0441793

(51) Int. Cl.
*G06F 11/22* (2006.01)
*G06F 17/50* (2006.01)

(52) U.S. Cl.
CPC ................................ *G06F 17/5036* (2013.01)

(58) Field of Classification Search
USPC ........................................ 716/106, 111, 136
See application file for complete search history.

(56) References Cited

U.S. PATENT DOCUMENTS

| | | | | |
|---|---|---|---|---|
| 8,311,659 | B1* | 11/2012 | Chen | ...................... H01L 22/20 700/108 |
| 2004/0015793 | A1* | 1/2004 | Saxena | .............. G01R 31/3167 716/102 |
| 2005/0132306 | A1* | 6/2005 | Smith | ................. G06F 17/5068 716/114 |
| 2006/0100873 | A1* | 5/2006 | Bittner | ................ G06F 17/5036 704/256.2 |

\* cited by examiner

*Primary Examiner* — Brian Ngo
(74) *Attorney, Agent, or Firm* — Cooper Legal Group, LLC

(57) ABSTRACT

One or more systems and techniques for modeling are provided. An original device model, such as a SPICE model, is used as a basis for fabricating a semiconductor arrangement, such as an integrated circuit arrangement, upon a semiconductor wafer. Fabrication process variations cause measured e-parameters and measured size e-parameters of the semiconductor arrangement to vary from original design parameters of the original device model. Accordingly, a partial set of e-parameters and a partial set of size e-parameters are measured from the semiconductor arrangement, and are expanded into a full set of e-parameters and a full set of size e-parameters using e-parameter derivation and size-centric derivation. The original device model is retargeted using the full set of e-parameters and the full set of size e-parameters to create a new device model that more accurately represents the real-world or fabricated semiconductor arrangement.

20 Claims, 10 Drawing Sheets

500 →

501 →
$$\begin{pmatrix} ep_3(i,1,k,l) \\ ep_3(i,2,k,l) \\ \vdots \\ ep_3(i,j,k,l) \end{pmatrix} = \begin{pmatrix} a(i,1,k,l) & b(i,1,k,l) & c(i,1,k,l) & d(i,1,k,l) \\ a(i,2,k,l) & b(i,2,k,l) & c(i,2,k,l) & d(i,2,k,l) \\ \vdots & \vdots & \vdots & \vdots \\ a(i,j,k,l) & b(i,j,k,l) & c(i,j,k,l) & d(i,j,k,l) \end{pmatrix} \begin{pmatrix} ep_1^3(i) \\ ep_1^2(i) \\ ep_1^1(i) \\ 1 \end{pmatrix}$$

502 →
$$\begin{pmatrix} ep_{3\_target}(i,1,k,l) \\ ep_{3\_target}(i,2,k,l) \\ \vdots \\ ep_{3\_target}(i,j,k,l) \end{pmatrix} = \begin{pmatrix} a(i,1,k,l) & b(i,1,k,l) & c(i,1,k,l) & d(i,1,k,l) \\ a(i,2,k,l) & b(i,2,k,l) & c(i,2,k,l) & d(i,2,k,l) \\ \vdots & \vdots & \vdots & \vdots \\ a(i,j,k,l) & b(i,j,k,l) & c(i,j,k,l) & d(i,j,k,l) \end{pmatrix} \begin{pmatrix} ep_{1\_derive}^3(i) \\ ep_{1\_derive}^2(i) \\ ep_{1\_derive}^1(i) \\ 1 \end{pmatrix}$$

504 →
$$\begin{pmatrix} ep_{3\_target}(1,l) \\ ep_{3\_target}(2,l) \\ \vdots \\ ep_{3\_target}(j,l) \end{pmatrix} = \begin{pmatrix} \sum_{i=1}^{M}\sum_{k=1}^{S} ep_{3\_target}(i,1,k,l)\big/(M*S) \\ \sum_{i=1}^{M}\sum_{k=1}^{S} ep_{3\_target}(i,2,k,l)\big/(M*S) \\ \vdots \\ \sum_{i=1}^{M}\sum_{k=1}^{S} ep_{3\_target}(i,j,k,l)\big/(M*S) \end{pmatrix}$$

FIG. 5

PARAMETER MODELING FOR SEMICONDUCTOR ARRANGEMENTS

BACKGROUND

Semiconductor arrangements, such as integrated circuit arrangements, are modeled using device models, such as a simulation program with integrated circuit emphasis (SPICE) model. Such modeling often occurs prior to fabrication to determine expected performance of semiconductor arrangements. When the modeling indicates undesired performance, a design of a semiconductor arrangement is modified prior to fabrication. Tests are performed during fabrication by measuring wafer acceptance test (WAT) parameters, such as resistance, current, etc. WAT parameters comprise measurements taken at different probe points during various stages of fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is an illustration of one or more equations for size-centric derivation, in accordance with some embodiments.

DETAILED DESCRIPTION

Figure 1:
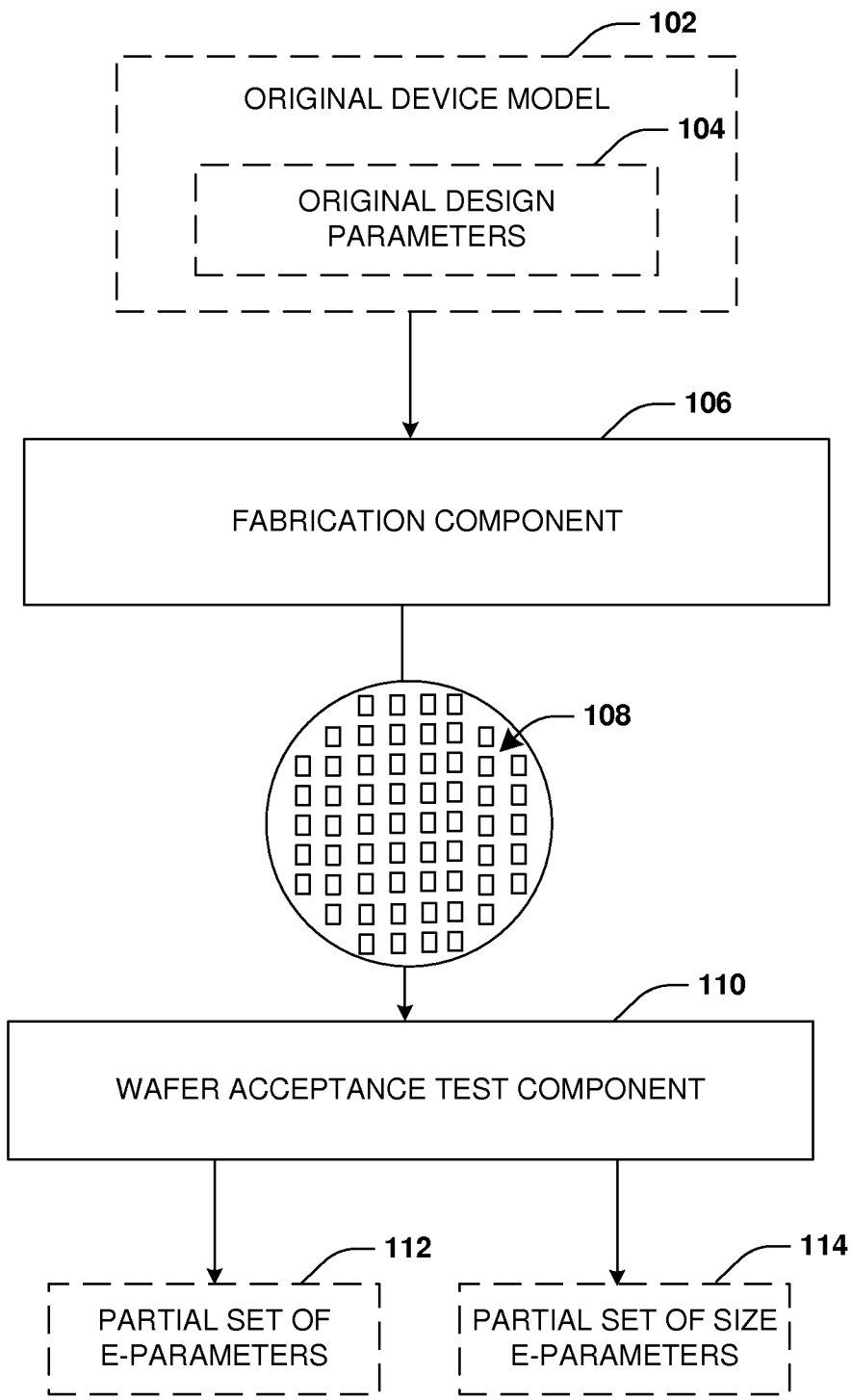
FIG. 1 is an illustration of measuring parameters of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more systems and techniques for modeling are provided herein. An original device model, such as a SPICE model, is used as a guide to fabricate a semiconductor arrangement. At times, however, actual e-parameters of the semiconductor arrangement, such as a voltage threshold parameter, a saturation current parameter, a transconductance parameter, a transimpedance parameter, a cutoff current parameter, a width parameter, a length parameter, or a variety of other parameters corresponding to various sizes of devices, differ from original design parameters within the original device model due to fabrication process variations or other unpredictable variations that occur during fabrication of the semiconductor arrangement.

In some embodiments, an e-parameter comprises an electrical characteristic of a device, such as a transistor or other semiconductor device, formed on a semiconductor wafer. In some embodiments, the electrical characteristic comprises at least one of an AC electrical characteristic or a DC electrical characteristic. In some embodiments, the electrical characteristic comprises at least one of a voltage threshold electrical characteristic, a saturation current electrical characteristic, a transconductance electrical characteristic, a transimpedance electrical characteristic, a cutoff current electrical characteristic, or other electrical characteristic of a device. Electrical characteristics of a device are indicative of operational characteristics of the device, such as operating voltage and current, device speed, threshold values, operational limitations such as a cutoff current, or a variety of other characteristics of how the device performs.

E-parameters are used to model how devices will operate or rather devices are modeled according to e-parameters to determine how the device will operate under conditions specified by the e-parameters. Due to the virtually limitless number of available e-parameters, merely a few e-parameters are measured from a semiconductor wafer, such as during a wafer acceptance test, to derive a partial set of e-parameters comprising e-parameters measured from a semiconductor wafer, which are referred to herein at measured e-parameters. Accordingly, as provided herein, e-parameter derivation is performed to expand the partial set of e-parameter to a full set of e-parameters comprising the measured e-parameters and one or more derived e-parameters derived by the e-parameter derivation. In this way, devices can be more accurately and fully modeled, such as for identification of operational characteristics of a device, using the full set of e-parameters instead of merely the partial set of e-parameters.

In some embodiments, a size e-parameter corresponds to an e-parameter comprising an electrical characteristic associated with a particular device size. However, merely a partial set of size e-parameters, corresponding to less than all device sizes of devices formed on the semiconductor wafer, are measured from the semiconductor wafer. Accordingly, as provided herein, size-centric derivation is performed to expand a partial set of size e-parameters to a full set of e-parameters comprising the measured size e-parameters measured from the semiconductor wafer and one or more derived size e-parameters derived by the size e-parameter derivation. In this way, devices of various device sizes are more accurately and fully modeled using the full set of size e-parameters instead of merely the partial set of size e-parameters.

In some embodiments, modeling is adjusted or retargeted to more closely approximate actual or real world parameters of a fabricated semiconductor arrangement. In some embodiments, a partial set of e-parameters and a partial set of size e-parameters are measured from the semiconductor arrangement, such as during a wafer acceptance test after a fabrication stage or from a user stimuli of device characteristics. E-parameter derivation is performed to expand the partial set of e-parameters to a full set of e-parameters comprising one or more derived e-parameters, such as an e-parameter derived from a correlation matrix and one or more measured e-parameters within the partial set of e-parameters. Size-centric derivation is performed to expand the partial set of size e-parameters to a full set of size e-parameters comprising one or more derived size e-parameters, such as a size e-parameter derived from the correlation matrix and one or more measured size e-parameters within the partial set of size e-parameters. The original device model is retargeted using at least one of the full set of e-parameters or the full set of size e-parameters to create a new device model that models the semiconductor arrangement more accurately than the original device model.

FIG. 1 illustrates a wafer acceptance test component 110 measuring parameters of a semiconductor arrangement 108. A fabrication component 106 is configured to fabricate the semiconductor arrangement 108 based upon original design parameters 104 specified, at least in part, by an original device model 102, such as design layout parameters derived from a SPICE model. In some embodiments, the fabrication component 106 forms devices, such as transistors and connectivity, of the semiconductor arrangement 108 on a semiconductor wafer based upon the original design parameters 104. The wafer acceptance test component 110 is configured to measure parameters at various probe points during various stages of fabrication, such as wafer acceptance test parameters obtained after a silicon process or from user stimuli of device characteristics. In some embodiments, the wafer acceptance test component 110 measures a partial set of e-parameters 112, such as a measured voltage threshold e-parameter and a measured saturation current e-parameter, but is unable to measure other desired e-parameters, such as a transconductance e-parameter, a transimpedance e-parameter, a cutoff current e-parameter, etc. In some embodiments, the wafer acceptance test component 110 measures a partial set of size e-parameters 114, such as e-parameters measured from devices having particular sizes such as a first size e-parameter of a first device having a first device size, but lacks size e-parameters of other device sizes such as a second size e-parameter corresponding to a second e-parameter of a second device having a second device size. In this way, the partial set of e-parameters 112 and the partial set of size e-parameters 114 are obtained.

Figure 2:
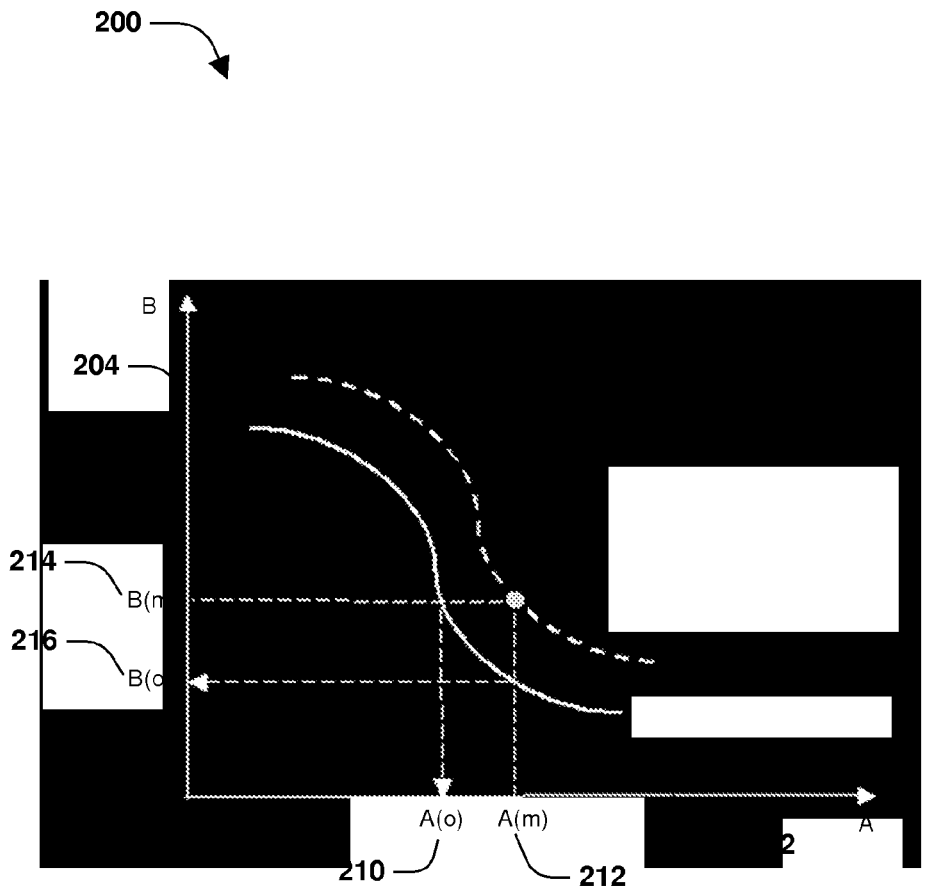
FIG. 2 is an illustration of a graph indicating a difference between original design parameters of an original device model and measured e-parameters of a semiconductor arrangement, in accordance with some embodiments.

FIG. 2 illustrates a graph 200 indicating a difference between original design parameters 104 of the original device model 102 and measured e-parameters of the semiconductor arrangement 108 such as actual physical e-parameters and size e-parameters measured from the semiconductor arrangement 108. The graph 200 comprises an x-axis 202 that corresponds to potential values for an A e-parameter. The graph 200 comprises a y-axis 204 that corresponds to potential values for a B e-parameter. The graph 200 comprises a first curve 206 that is a function of the original device model 102. The graph 200 comprises a second curve 208 that is a function of measured parameter data obtained from the semiconductor arrangement 108. The second curve 208 is indicative of a measured A e-parameter 212 and a measured B e-parameter 214 measured from the semiconductor arrangement 108. The first curve 206 is indicative of an original A e-parameter 210 and an original B e-parameter 216 from the original device model 102. Because of variations induced during fabrication of the semiconductor arrangement 108, the measured A e-parameter 112 does not match the original A e-parameter 210 and the measured B e-parameter 214 does not match the original B e-parameter 216. As provided herein, the original device model 102 is retargeted using at least one of a full set of e-parameters or a full set of size e-parameters to create a new device model that more accurately reflects the measured parameters of the semiconductor arrangement 108, as represented by the second curve 208.

Figure 3:
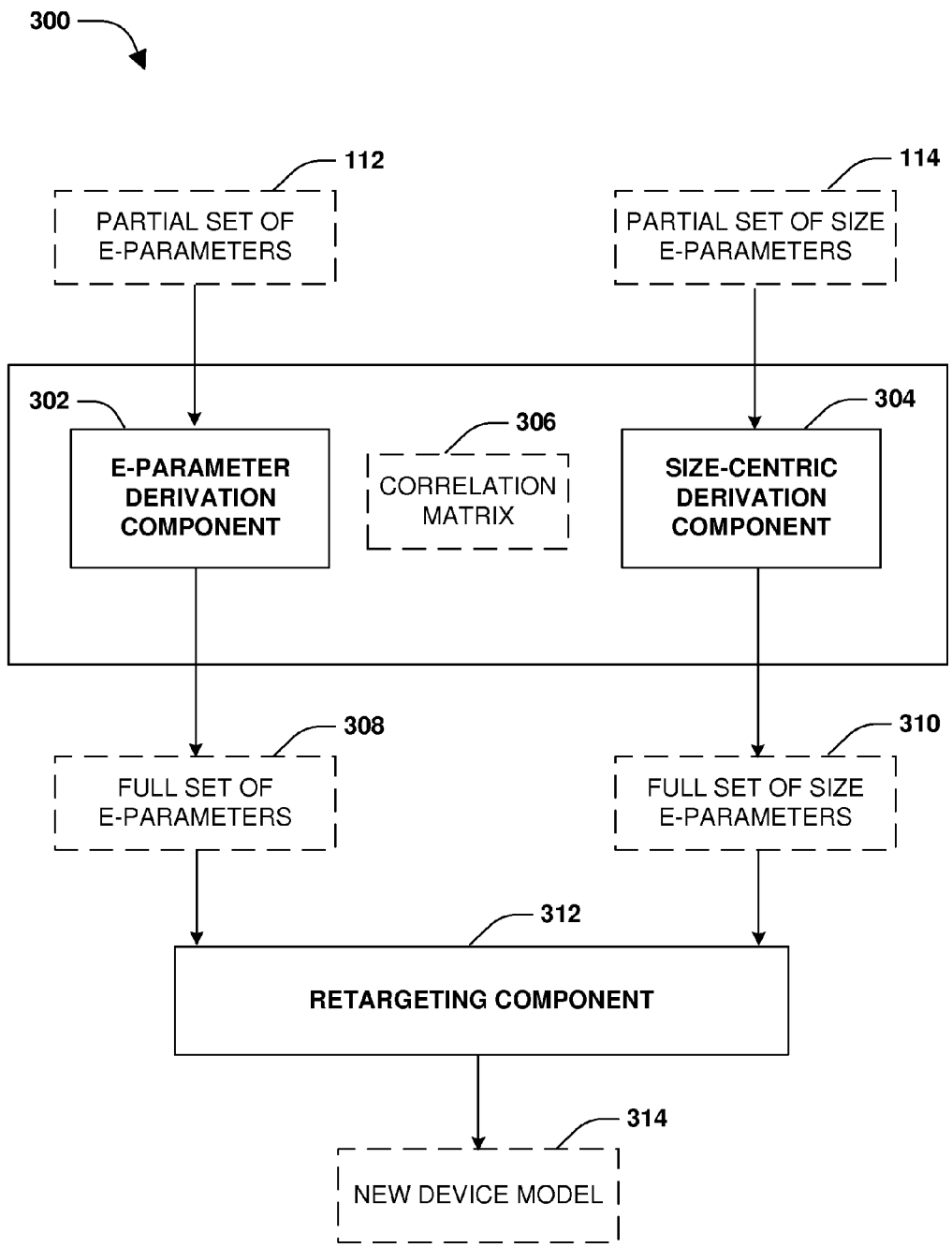
FIG. 3 is an illustration of a system configured to model at least one of e-parameters or size e-parameters, in accordance with some embodiments.

FIG. 3 illustrates a system 300 configured to model at least one of e-parameters or size e-parameters. The system 300 comprises at least one of an e-parameter derivation component 302, a size-centric derivation component 304, or a retargeting component 312. The e-parameter derivation component 302 is configured to obtain the partial set of e-parameters 112 measured from the semiconductor arrangement 108. In some embodiments, the partial set of e-parameters 112 comprises a subset of e-parameters used for SPICE modeling, such as the measured voltage threshold e-parameter and the measured saturation current e-parameter, but lacks other e-parameters. Accordingly, the e-parameter derivation component 302 is configured to perform e-parameter derivation to expand the partial set of e-parameters 112 to a full set of e-parameters 308. The full set of e-parameters 308 comprises one or more derived e-parameters that are derived from the partial set of e-parameters 112. In some embodiments, the full set of e-parameters 308 comprises the one or more measured e-parameters within the partial set of e-parameters 112. In some embodiments, the full set of e-parameters 308 comprises a threshold number of e-parameters for SPICE modeling of the semiconductor arrangement 108, such as the measured voltage threshold e-parameter, the measured saturation current e-parameter, a derived saturation current e-parameter, a derived transconductance e-parameter, a derived transimpedance e-parameter, a derived cutoff current e-parameter, etc.

Figure 4:
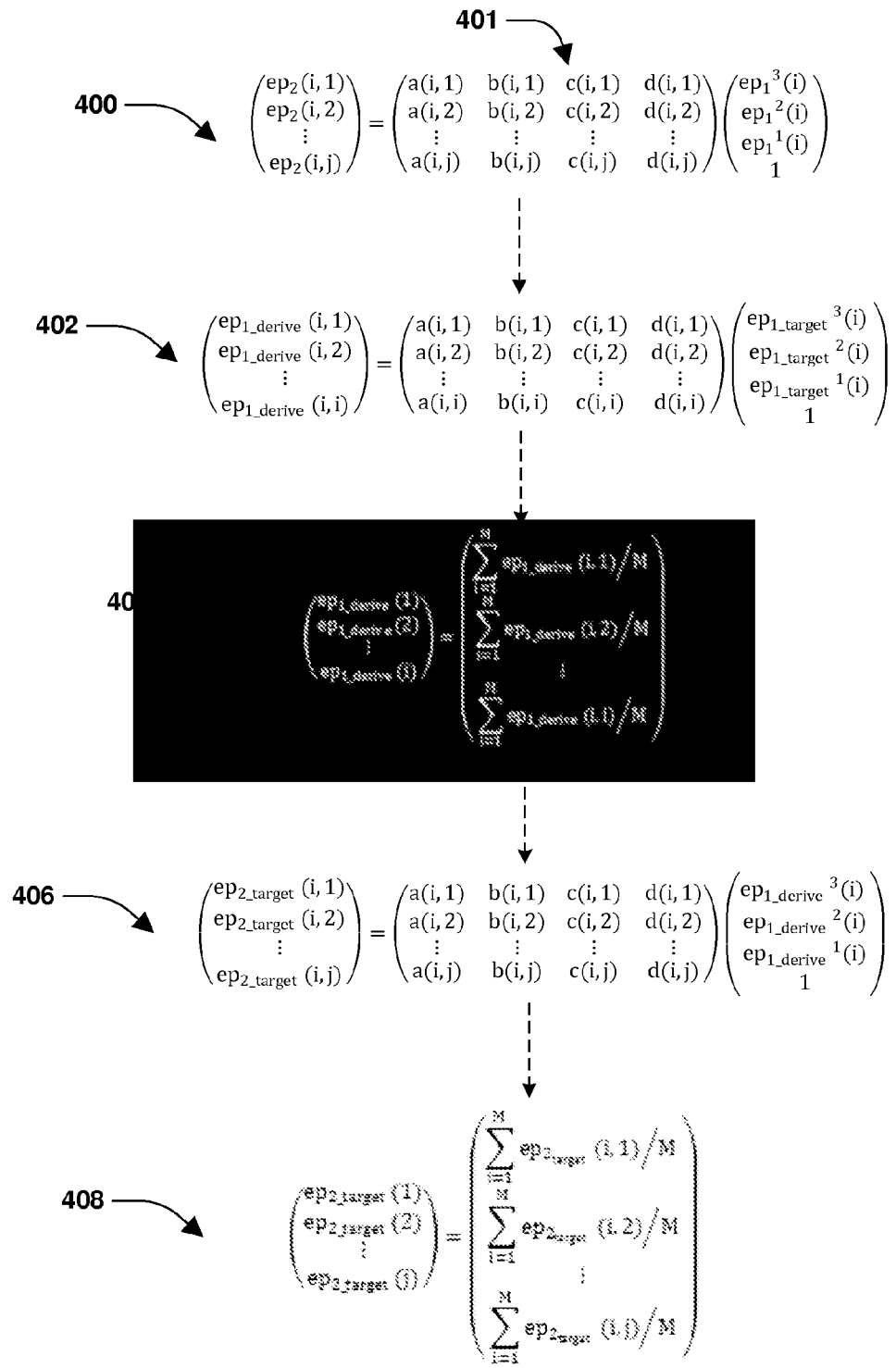
FIG. 4 is an illustration of one or more equations for e-parameter derivation, in accordance with some embodiments.

In some embodiments of performing e-parameter derivation, the partial set of e-parameters 112 is evaluated to identify a target e-parameter, such as a target transconductance e-parameter, not comprised within the partial set of e-parameters 112. As illustrated in FIG. 4, a first equation 400 is used to extract a correlation matrix 401 from the original device model 102 utilizing at least one measured e-parameter within the partial set of e-parameters 112, where ep1 corresponds to the at least one measured e-parameter such as the measured voltage threshold parameter and the measured saturation current e-parameter, ep2 corresponds to all e-parameters such as measured e-parameters and target e-parameters that are to be derived, M corresponds to the number of measured e-parameters, N corresponds to the number of all e-parameters, i corresponds to 1–M, j corresponds to 1–N, and a, b, c, and d correspond to matrix parameters. A second equation 402 is used to derive an e-parameter using the correlation matrix 401 to create a derived e-parameter for inclusion within the full set of e-parameters 308, where ep1_target corresponds to a target e-parameter and ep1_derive corresponds to the derived e-parameter. A third equation 404 is used to derive the derived e-parameter based upon all target e-parameters. A fourth equation 406 is used to derive other e-parameters to create derived e-parameters for inclusion within the full set of e-parameters 308. A fifth equation 408 is used to derive other e-parameters based upon all e-parameters. In this way, the full set of e-parameters 308 is created.

The size-centric derivation component 304 is configured to obtain the partial set of size e-parameters 114 measured from the semiconductor arrangement 108. In some embodiments, the partial set of size e-parameters 114 comprises a subset of size e-parameters used for SPICE modeling, such as the first size e-parameter corresponding to the first e-parameter of the first device having the first device size. Accordingly, the size-centric derivation component 304 is configured to perform size-centric derivation to expand the partial set of size e-parameters 114 to a full set of size e-parameters 310. The full set of size e-parameters 310 comprises one or more derived size e-parameters that are derived from the partial set of size e-parameters 114, such as a derived size e-parameter corresponding to the second e-parameter for the second device size. In some embodiments, the full set of size e-parameters 310 comprises the one or more measured size e-parameters within the partial set of size e-parameters 114. In some embodiments, the full set of size e-parameters 310 comprises a threshold number of size e-parameters for SPICE modeling of the semiconductor arrangement 108, such as e-parameters for a threshold number of different device sizes.

In some embodiments of performing size-centric derivation, the partial set of size e-parameters 114 is evaluated to identify a target size e-parameter, corresponding to a target e-parameter for a target device size, not comprised within the partial set of size e-parameters 114. As illustrated in FIG. 5, a first equation 500 is used to extract a correlation matrix 501 from the original device model 102 utilizing at least one measured size e-parameter, where ep1 corresponds to at least one measured e-parameter, ep3 corresponds to all size e-parameters, M corresponds to the number of measured e-parameters, N corresponds to the number of all size e-parameters, i corresponds to 1–M, j corresponds to 1–N, k corresponds to 1 minus the number of measured size e-parameters, l corresponds to 1 minus the number of size e-parameters, and a, b, c, and d correspond to matrix parameters. A second equation 502 is used to derive a size e-parameter using the correlation matrix 501 to create a derived size e-parameter for inclusion within the full set of size e-parameters 310, where ep1_derive corresponds to a derived e-parameter and ep3_target corresponds all size e-parameters. A third equation 504 is used to derive a size e-parameter based upon all e-parameters of all size e-parameters. In this way, the full set of size e-parameters 310 is created.

The retargeting component 312 is configured to retarget the original device model 102 using at least one of the full set of e-parameters 308 or the full set of size e-parameters 310 to create the new device model 314. In some embodiments, the new device model 314 more accurately represents e-parameters, size e-parameters, and other characteristics of the semiconductor arrangement 108 than the original device model 102. In some embodiments, a set of model simulation parameters are selected for inclusion within the new device model 314 based upon the full set of e-parameters 308 and the full set of size e-parameters 310. In some embodiments, a least square function is applied to the set of model simulation parameters to create a new set of model simulation parameters for inclusion within the new device model 314.

Figure 6:
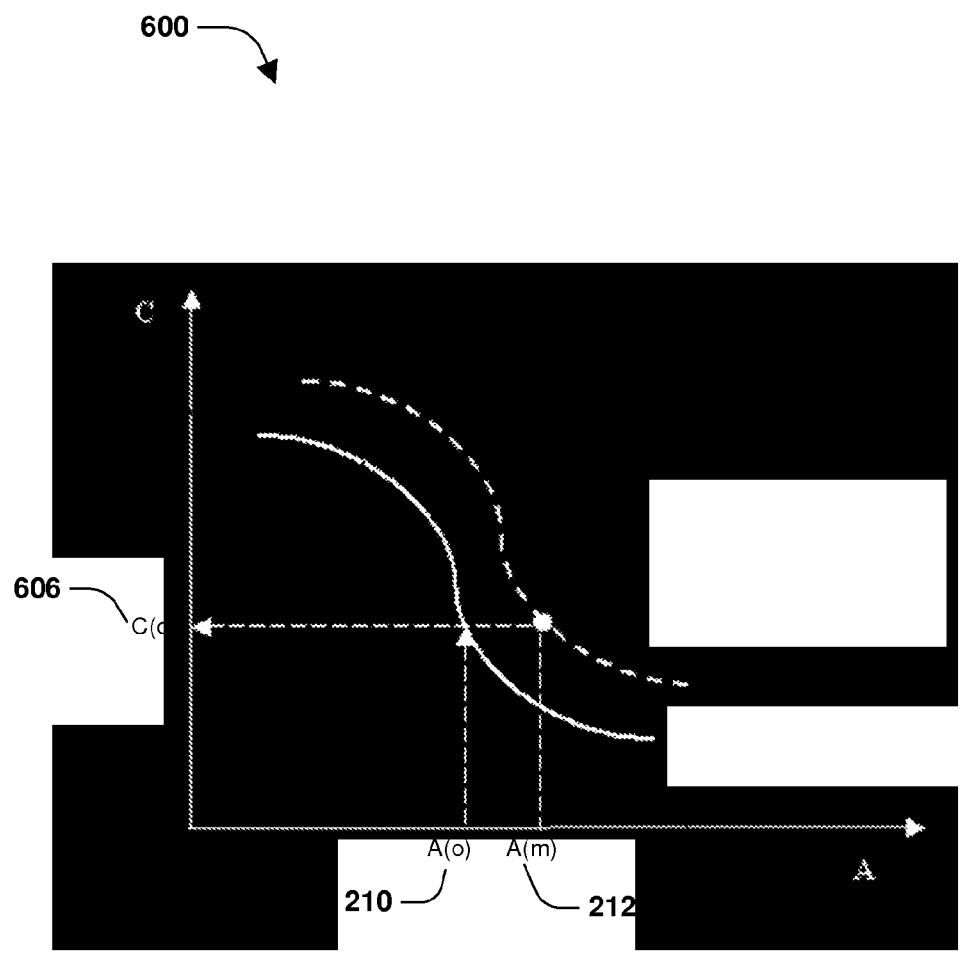
FIG. 6 is an illustration of a graph indicating a correspondence between measured e-parameters of a semiconductor arrangement and simulation parameters within a new device model, in accordance with some embodiments.

FIG. 6 illustrates a graph 600 indicating a correspondence between measured e-parameters of the semiconductor arrangement 108 and simulation parameters within the new device mode 314. The graph 600 comprises an x-axis 602 that corresponds to potential values for an A e-parameter. The graph 600 comprises a y-axis 604 that corresponds to potential values for a C e-parameter. The graph 600 comprises the first curve 206 that is a function of the original device model 102. The graph 600 comprises a new curve 608 that is a function of the new device model 314. The new curve 608 is indicative of a measured A e-parameter 212 measured from the semiconductor arrangement 108. The first curve 206 is indicative of an original A e-parameter 210 from the original device model 102. A derived C e-parameter 606 is obtained based upon an e-parameter derivation that utilizes at least one of the measured A e-parameter 212 or the original A e-parameter 210. In this way, derived e-parameters are obtained for inclusion within the full set of e-parameters 308.

Figure 7:
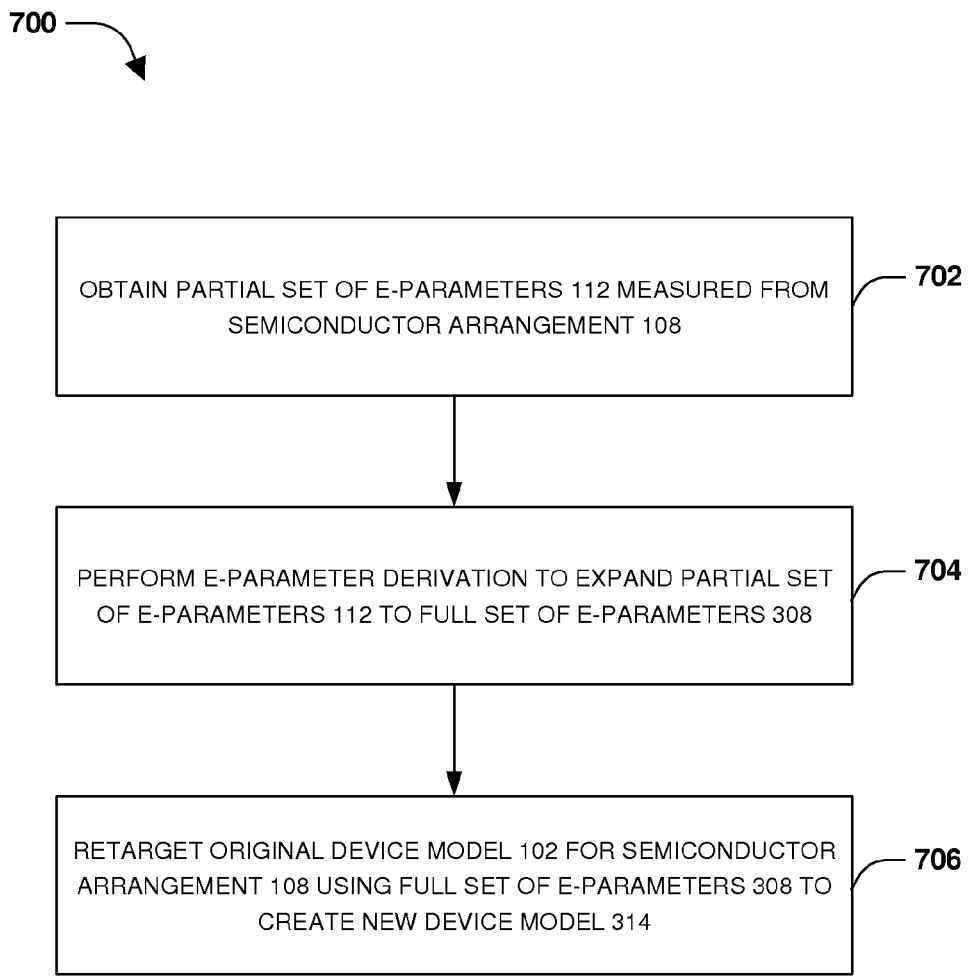
FIG. 7 is a flow diagram illustrating a method of modeling using e-parameters, in accordance with some embodiments.

A method 700 of modeling is illustrated in FIG. 7. At 702, the partial set of e-parameters 112, measured from the semiconductor arrangement 108, is obtained. The partial set of e-parameters 112 comprises one or more measured e-parameters. At 704, e-parameter derivation is performed to expand the partial set of e-parameters 112 to the full set of e-parameters 308 comprising one or more derived e-parameters. In some embodiments, a determination is made that the partial set of e-parameters 112 does not comprise a target e-parameter. The correlation matrix 401 is extracted from the original device model 102 utilizing at least one measured e-parameter. The target e-parameter is derived using the correlation matrix 401 to create a derived e-parameter for inclusion within the full set of e-parameters 308. In this way, the full set of e-parameters 308 is created. At 706, the original device model 102 for the semiconductor arrangement 108 is retargeted using the full set of e-parameters 308 to create the new device model 314 that models the semiconductor arrangement 108.

Figure 8:
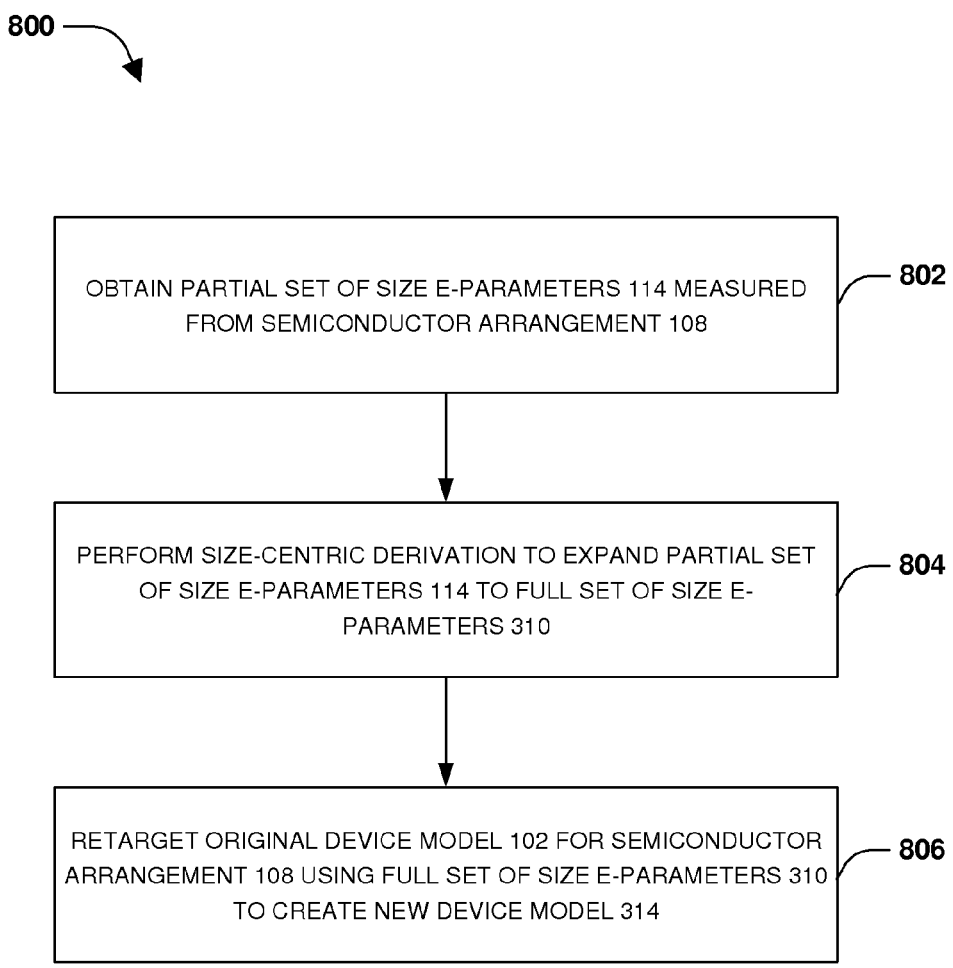
FIG. 8 is a flow diagram illustrating a method of modeling using size e-parameters, in accordance with some embodiments.

A method 800 of modeling is illustrated in FIG. 8. At 802, the partial set of size e-parameters 114, measured from the semiconductor arrangement 108, is obtained. The partial set of size e-parameters 114 comprises one or more measured size e-parameters. At 804, size-centric derivation is performed to expand the partial set of size e-parameters 114 to the full set of size e-parameters 310 comprising one or more derived size e-parameters. In some embodiments, a determination is made that the partial set of size e-parameters 114 does not comprise a target size e-parameter. A correlation matrix 501 is extracted from the original device model 102 utilizing at least one measured size e-parameter. The target size e-parameter is derived using the correlation matrix 501 to create a derived size e-parameter for inclusion within the full set of size e-parameters 310. In this way, the full set of size e-parameters 310 is created. At 806, the original device model 102 for the semiconductor arrangement 108 is retargeted using the full set of size e-parameters 310 to create the new device model 314 that models the semiconductor arrangement 108.

Figure 9:
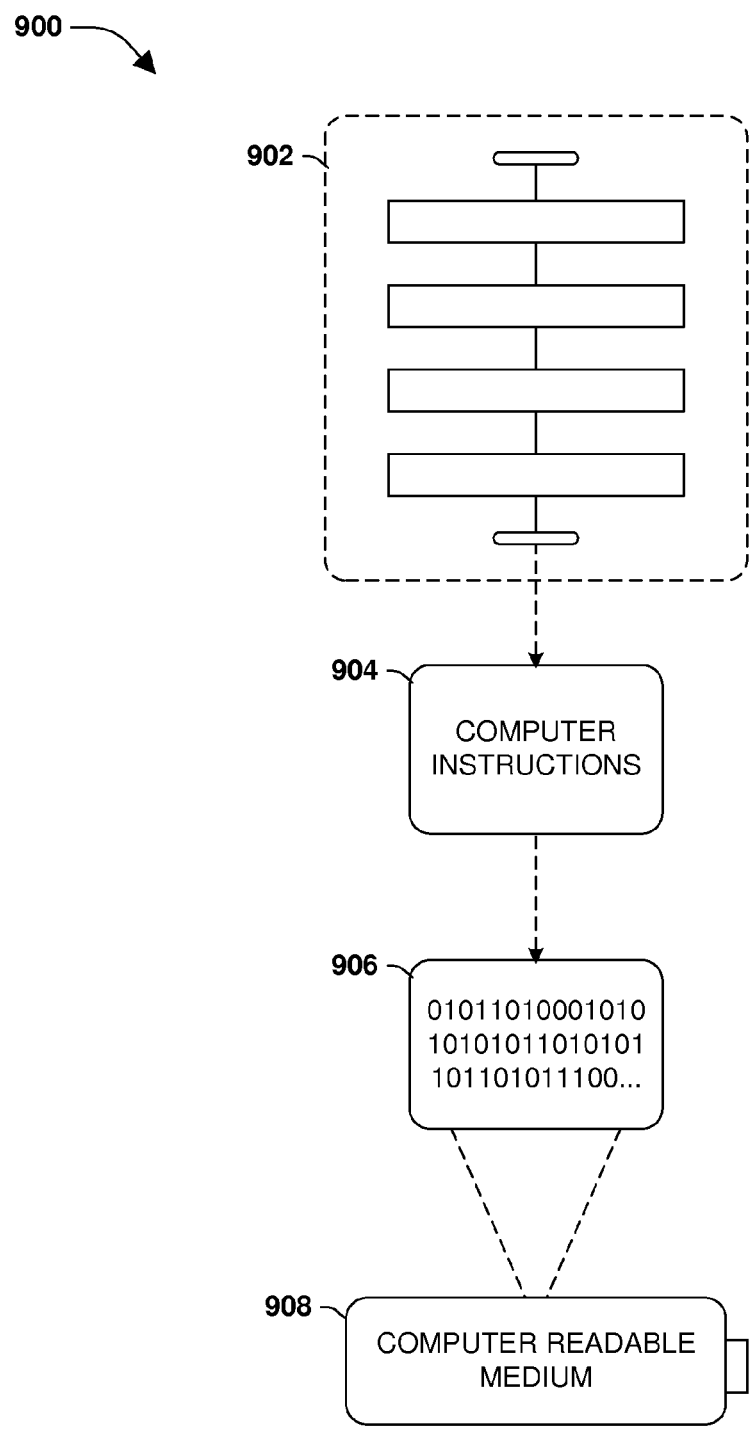
FIG. 9 is an illustration of an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 9, wherein the implementation 900 comprises a computer-readable medium 908 (e.g., a CD-R, DVD-R, flash drive, a platter of a hard disk drive, etc.), on which is encoded computer-readable data 906. This computer-readable data 906 in turn comprises a set of computer instructions 904 configured to operate according to one or more of the principles set forth herein. In one such embodiment 900, the processor-executable computer instructions 904 may be configured to perform a method 902, such as at least some of the exemplary method 700 of FIG. 7 and/or at least some of the exemplary method 800 of FIG. 8, for example. In another such embodiment, the processor-executable instructions 912 may be configured to implement a system, such as at least some of the exemplary system 300 of FIG. 3, for example. Many such computer-readable media may be devised by those of ordinary skill in the art that are configured to operate in accordance with the techniques presented herein.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 10:
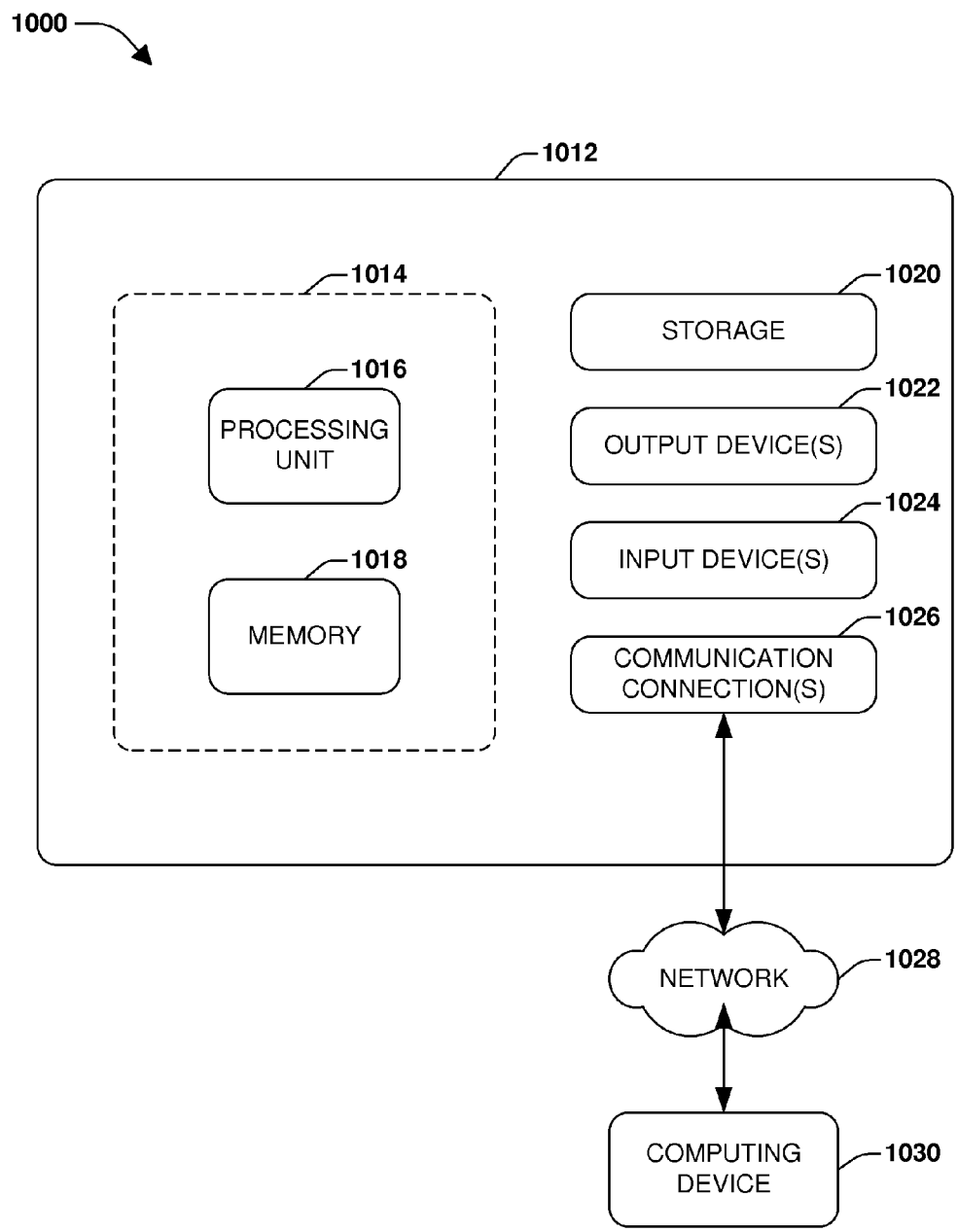
FIG. 10 illustrates an example computing environment wherein one or more of the provisions set forth herein may be implemented, in accordance with some embodiments.

FIG. 10 and the following discussion provide a brief, general description of a suitable computing environment to implement embodiments of one or more of the provisions set forth herein. The operating environment of FIG. 10 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 10 illustrates an example of a system 1000 comprising a computing device 1012 configured to implement one or more embodiments provided herein. In one configuration, computing device 1012 includes at least one processing unit 1016 and memory 1018. Depending on the exact configuration and type of computing device, memory 1018 may be volatile (such as RAM, for example), non-volatile (such as ROM, flash memory, etc., for example) or some combination of the two. This configuration is illustrated in FIG. 10 by dashed line 1014.

In other embodiments, device 1012 may include additional features and/or functionality. For example, device 1012 may also include additional storage (e.g., removable and/or non-removable) including, but not limited to, magnetic storage, optical storage, and the like. Such additional storage is illustrated in FIG. 10 by storage 1020. In some embodiments, computer readable instructions to implement one or more embodiments provided herein may be in storage 1020. Storage 1020 may also store other computer readable instructions to implement an operating system, an application program, and the like. Computer readable instructions may be loaded in memory 1018 for execution by processing unit 1016, for example.

The term "computer readable media" as used herein includes computer storage media. Computer storage media includes volatile and nonvolatile, removable and non-removable media implemented in any method or technology for storage of information such as computer readable instructions or other data. Memory 1018 and storage 1020 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1012. Any such computer storage media may be part of device 1012.

Device 1012 may also include communication connection(s) 1026 that allows device 1012 to communicate with other devices. Communication connection(s) 1026 may include, but is not limited to, a modem, a Network Interface Card (NIC), an integrated network interface, a radio frequency transmitter/receiver, an infrared port, a USB connection, or other interfaces for connecting computing device 1012 to other computing devices. Communication connection(s) 1026 may include a wired connection or a wireless connection. Communication connection(s) 1026 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 1012 may include input device(s) 1024 such as keyboard, mouse, pen, voice input device, touch input device, infrared cameras, video input devices, and/or any other input device. Output device(s) 1022 such as one or more displays, speakers, printers, and/or any other output device may also be included in device 1012. Input device(s) 1024 and output device(s) 1022 may be connected to device 1012 via a wired connection, wireless connection, or any combination thereof. In some embodiments, an input device or an output device from another computing device may be used as input device(s) 1024 or output device(s) 1022 for computing device 1012.

Components of computing device 1012 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 1012 may be interconnected by a network. For example, memory 1018 may be comprised of multiple physical memory units located in different physical locations interconnected by a network.

Those skilled in the art will realize that storage devices utilized to store computer readable instructions may be distributed across a network. For example, a computing device 1030 accessible via a network 1028 may store computer readable instructions to implement one or more embodiments provided herein. Computing device 1012 may access computing device 1030 and download a part or all of the computer readable instructions for execution. Alternatively, computing device 1012 may download pieces of the computer readable instructions, as needed, or some instructions may be executed at computing device 1012 and some at computing device 1030.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a method for modeling is provided. The method comprises obtaining a partial set of e-parameters measured from a semiconductor arrangement. The partial set of e-parameters comprises one or more measured e-parameters. E-parameter derivation is performed to expand the partial set of e-parameters to a full set of e-parameters comprising one or more derived e-parameters. An original device model for the semiconductor arrangement is retargeted using the full set of e-parameters to create a new device model that models the semiconductor arrangement.

According to an aspect of the instant disclosure, a system for modeling is provided. The system comprises an e-parameter derivation component, a size-centric derivation component, and a retargeting component. The e-parameter derivation component is configured to obtain a partial set of e-parameters measured from a semiconductor arrangement. The partial set of e-parameters comprises one or more measured e-parameters. The e-parameter derivation component is configured to perform e-parameter derivation to expand the partial set of e-parameters to a full set of e-parameters comprising one or more derived e-parameters. The size-centric derivation component is configured to obtain a partial set of size e-parameters measured from the semiconductor arrangement. The partial set of size e-parameters comprises one or more measured size e-parameters. A measured size e-parameter corresponds to a first e-parameter of a first device within the semiconductor arrangement, the first device having a first device size. The size-centric derivation component is configured to perform size-centric derivation to expand the partial set of size e-parameters to a full set of size e-parameters comprising one or more derived size e-parameters. A derived size e-parameter corresponds to second e-parameter for a second device size different than the first device size The retargeting component is configured to retarget an original device model for the semiconductor arrangement using at least one of the full set of e-parameters or the full set of size e-parameters to create a new device model that models the semiconductor arrangement.

According to an aspect of the instant disclosure, a method for modeling is provided. The method comprises obtaining a partial set of size e-parameters measured from a semiconductor arrangement. The partial set of size e-parameters comprises one or more measured size e-parameters. A measured size e-parameter corresponds to a first e-parameter of a first device within the semiconductor arrangement. The first device has a first device size. Size-centric derivation is performed to expand the partial set of size e-parameters to a full set of size e-parameters comprising one or more derived size e-parameters. A derived size e-parameter corresponds to a second e-parameter for a second device size different than the first device size. An original device model for the semiconductor arrangement is retargeted using the full set of size e-parameters to create a new device model that models the semiconductor arrangement.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed:

1. A method for modeling, comprising:
    obtaining a partial set of e-parameters measured from a semiconductor arrangement created using an original device model for the semiconductor arrangement, the partial set of e-parameters comprising one or more measured e-parameters;
    performing e-parameter derivation to expand the partial set of e-parameters to a full set of e-parameters, wherein:
        the performing e-parameter derivation comprises:
            determining that the partial set of e-parameters does not comprise a target e-parameter;
            extracting a correlation matrix from the original device model utilizing at least one measured e-parameter; and
            deriving the target e-parameter using the correlation matrix to create a derived e-parameter for inclusion within the full set of e-parameters, and
        the full set of e-parameters comprises the derived e-parameter; and
    retargeting the original device model using the full set of e-parameters to create a new device model, different than the original device model, that models the semiconductor arrangement.

2. The method of claim 1, comprising:
    obtaining a partial set of size e-parameters measured from the semiconductor arrangement, the partial set of size e-parameters comprising one or more measured size e-parameters, a measured size e-parameter corresponding to a first e-parameter of a first device within the semiconductor arrangement, the first device having a first device size;
    performing size-centric derivation to expand the partial set of size e-parameters to a full set of size e-parameters, the full set of size e-parameters comprising one or more derived size e-parameters, a derived size e-parameter corresponding to second e-parameter for a second device size different than the first device size; and
    retargeting the original device model for the semiconductor arrangement using the full set of size e-parameters to create the new device model.

3. The method of claim 1, comprising:
    deriving one or more additional derived e-parameters, for inclusion within the full set of e-parameters, utilizing the correlation matrix.

4. The method of claim 1, the full set of e-parameters comprising the one or more measured e-parameters.

5. The method of claim 1, the full set of e-parameters comprising a threshold number of e-parameters used for SPICE modeling.

6. The method of claim 2, the performing size-centric derivation comprising:
    determining that the partial set of size e-parameters does not comprise a target size e-parameter corresponding to a target e-parameter for a target device size;
    extracting a correlation matrix from the original device model utilizing at least one measured size e-parameter; and
    deriving the target size e-parameter using the correlation matrix to create a derived size e-parameter, for the target device size, for inclusion within the full set of size e-parameters.

7. The method of claim 6, the extracting a correlation matrix comprising:
    utilizing at least one measured size e-parameter for extracting the correlation matrix.

8. The method of claim 6, comprising:
    deriving one or more additional derived size e-parameters, for inclusion within the full set of size e-parameters, utilizing the correlation matrix.

9. The method of claim 1, the obtaining comprising:
    obtaining the partial set of e-parameters from wafer acceptance test (WAT) data.

10. The method of claim 1, the obtaining comprising:
    obtaining the partial set of e-parameters from a user stimuli of device characteristics.

11. The method of claim 1, the full set of e-parameters comprising at least one of a voltage threshold derived parameter, a saturation current derived parameter, a transconductance derived parameter, a transimpedance derived parameter, or a cutoff current derived parameter.

12. The method of claim 1, the retargeting the original device model comprising:
    selecting a set of model simulation parameters, for inclusion within the new device model, based upon the full set of e-parameters.

13. The method of claim 1, the retargeting the original device model comprising:
    selecting a set of model simulation parameters based upon the full set of e-parameters; and
    applying a least square function to the set of model simulation parameters to create a new set of model simulation parameters for inclusion within the new device model.

14. A system configured to model at least one of e-parameters or size e-parameters comprising:
    an e-parameter derivation component configured to:
        obtain a partial set of e-parameters measured from a semiconductor arrangement, the partial set of e-parameters comprising one or more measured e-parameters; and perform e-parameter derivation to expand the partial set of e-parameters to a full set of e-parameters, wherein:
performing e-parameter derivation comprises:
determining that the partial set of e-parameters does not comprise a target e-parameter;
extracting a correlation matrix from an original device model for the semiconductor arrangement utilizing at least one measured e-parameter; and
deriving the target e-parameter using the correlation matrix to create a derived e-parameter for inclusion within the full set of e-parameters, and
the full set of e-parameters comprises derived e-parameter;
a size-centric derivation component configured to:
obtain a partial set of size e-parameters measured from the semiconductor arrangement, the partial set of size e-parameters comprising one or more measured size e-parameters, a measured size e-parameter corresponding to a first e-parameter of a first device within the semiconductor arrangement, the first device having a first device size; and
perform size-centric derivation to expand the partial set of size e-parameters to a full set of size e-parameters, wherein:
performing the size-centric derivation comprises:
determining that the partial set of size e-parameters does not comprise a target size e-parameter corresponding to a target e-parameter for a target device size;
extracting a correlation matrix from the original device model utilizing at least one measured size e-parameter; and
deriving the target size e-parameter using the correlation matrix to create a derived size e-parameter, for the target device size, for inclusion within the full set of size e-parameters,
the full set of size e-parameters comprises the derived size e-parameter, and
the derived size e-parameter corresponds to a second e-parameter for a second device size different than the first device size; and
a retargeting component configured to:
retarget the original device model using at least one of the full set of e-parameters or the full set of size e-parameters to create a new device model that models the semiconductor arrangement.

15. The system of claim 14, the retargeting component configured to:
select a set of model simulation parameters based upon the full set of e-parameters; and
apply a least square function to the set of model simulation parameters to create a new set of model simulation parameters for inclusion within the new device model.

16. A method for modeling, comprising:
obtaining a partial set of size e-parameters measured from a semiconductor arrangement created using an original device model for the semiconductor arrangement, the partial set of size e-parameters comprising one or more measured size e-parameters, a measured size e-parameter corresponding to a first e-parameter of a first device within the semiconductor arrangement, the first device having a first device size;
performing size-centric derivation to expand the partial set of size e-parameters to a full set of size e-parameters, wherein:
performing the size-centric derivation comprises:
determining that the partial set of size e-parameters does not comprise a target size e-parameter corresponding to a target e-parameter for a target device size;
extracting a correlation matrix from the original device model utilizing at least one measured size e-parameter; and
deriving the target size e-parameter using the correlation matrix to create a derived size e-parameter, for the target device size, for inclusion within the full set of size e-parameters,
the full set of size e-parameters comprises the derived size e-parameter, and
the derived size e-parameter corresponds to a second e-parameter for a second device size different than the first device size; and
retargeting the original device model using the full set of size e-parameters to create a new device model, different than the original device model, that models the semiconductor arrangement.

17. The method of claim 16, comprising:
obtaining a partial set of e-parameters measured from the semiconductor arrangement, the partial set of e-parameters comprising one or more measured e-parameters;
performing e-parameter derivation to expand the partial set of e-parameters to a full set of e-parameters, the full set of e-parameters comprising one or more derived e-parameters; and
retargeting the original device model for the semiconductor arrangement using the full set of e-parameters to create the new device model.

18. The method of claim 17, the performing e-parameter derivation comprising:
determining that the partial set of e-parameters does not comprise a target e-parameter;
extracting a correlation matrix from the original device model utilizing at least one measured e-parameter; and
deriving the target e-parameter using the correlation matrix to create a derived e-parameter for inclusion within the full set of e-parameters.

19. The method of claim 16, the obtaining comprising:
obtaining the partial set of e-parameters from wafer acceptance test (WAT) data.

20. The method of claim 16, the obtaining comprising:
obtaining the partial set of e-parameters from a user stimuli of device characteristics.

* * * * *

UNITED STATES PATENT AND TRADEMARK OFFICE
CERTIFICATE OF CORRECTION

| | | |
|---|---|---|
| PATENT NO. | : 9,684,747 B2 | Page 1 of 1 |
| APPLICATION NO. | : 14/612526 | |
| DATED | : June 20, 2017 | |
| INVENTOR(S) | : Huang et al. | |

It is certified that error appears in the above-identified patent and that said Letters Patent is hereby corrected as shown below:

In the Claims

Column 13, Line 15, Claim 14, please insert the word --the-- after the word --comprises-- and before the word --derived--.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*